(12) United States Patent
Hsu et al.

(10) Patent No.: US 9,575,114 B2
(45) Date of Patent: Feb. 21, 2017

(54) TEST SYSTEM AND DEVICE

(71) Applicant: Elite Semiconductor Memory Technology Inc., Hsinchu (TW)

(72) Inventors: Jen-Shou Hsu, Hsinchu (TW); Po-Hsun Wu, Kaohsiung (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 449 days.

(21) Appl. No.: 14/315,127

(22) Filed: Jun. 25, 2014

(65) Prior Publication Data

US 2015/0019927 A1 Jan. 15, 2015

Related U.S. Application Data

(60) Provisional application No. 61/844,705, filed on Jul. 10, 2013.

(51) Int. Cl.
*G01R 31/3177* (2006.01)
*G01R 31/28* (2006.01)

(52) U.S. Cl.
CPC ....... *G01R 31/2863* (2013.01); *G01R 31/2868* (2013.01); *G01R 31/2889* (2013.01)

(58) Field of Classification Search
CPC ......... G01R 31/2855–31/2868; G01R 31/2889
USPC ....................... 324/760.01–760.02, 761.01, 324/762.01–762.09
See application file for complete search history.

(56) References Cited

U.S. PATENT DOCUMENTS

| | | | | |
|---|---|---|---|---|
| 5,962,868 A | * | 10/1999 | Tanida | G01R 31/043 257/415 |
| 6,037,794 A | * | 3/2000 | Yamamoto | G01R 31/2886 324/750.08 |
| 6,229,329 B1 | * | 5/2001 | Nakata | G01R 31/2886 324/754.07 |
| 2009/0039909 A1 | * | 2/2009 | Kim | G01R 1/06794 324/750.3 |

* cited by examiner

*Primary Examiner* — Tung X Nguyen
*Assistant Examiner* — Lee Rodak
(74) *Attorney, Agent, or Firm* — Juan Carlos A. Marquez; Marquez IP Law Office, PLLC (57) ABSTRACT

An aspect of the present invention is to provide a test system for detecting whether a continuity fault condition, e.g., a short or open condition, exists in the path between a tester and chips on a wafer during a wafer level burn-in testing. According to one embodiment of the present invention, the test system comprises a probe card and n chips. The probe card comprises m first signal contacts for receiving m test signals from the tester, n second signal contacts for providing n test results to the tester, and a contact array. The probe card is in contact with the chips on the wafer through a plurality of needles. In this manner, the test system can detect whether the continuity fault condition exists in the path between the tester and the chips on the wafer during the wafer level burn-in testing.

12 Claims, 11 Drawing Sheets

TEST SYSTEM AND DEVICE

CROSS-REFERENCE TO RELATED APPLICATION

This application claims priority to U.S. Provisional Application No. 61/844,705 filed on Jul. 10, 2013, which is hereby incorporated by reference.

BACKGROUND OF THE INVENTION

Field of the Invention

The present invention relates to a test system and a device forming the test system.

Description of the Related Art

In conventional integrated circuit (IC) fabrication, many discrete ICs are formed as chips (dice) on the surface of a semiconductor wafer. After the fabrication process is complete, the wafer is scribed, thereby dividing the wafer into the individual chips. Each chip is then packaged into modules or incorporated into larger systems.

Due to defects in the wafer, or defects in one or more of the processing steps of the fabrication process, some of the individual chips may not function as designed. These defects may show up initially or may not be apparent until the chip has been in operation for an extended period of time. In order to identify the latent defective chips, a burn-in procedure is performed on the chips. During the burn-in procedure, the chips are hastened at the elevated temperature and a test controller statically or dynamically applies a set of bias voltages to selected chips so as to cause current conduction in the selected chips. After the burn-in procedure is complete, the chips undergo a chip probe (CP) test to screen out the latent defective chips prior to packaging.

During the traditional wafer level burn-in procedure, the chips only receive the set of bias voltages and will not sent back signals to the test controller. Therefore, the controller cannot confirm whether the burn-in procedure is certainly performed. For example, there may be a short or an open condition in the path between the controller and the chips, preventing the bias voltages from transmitting to the chips. As a result, the burn-in cannot be performed on the chips and the controller will mistake the non-burned chips for the latent defect chips during the following CP test.

SUMMARY OF THE INVENTION

An aspect of the present invention is to provide a test system for detecting whether a continuity fault condition, e.g., a short or open condition, exists in the path between a tester and chips on a wafer during a wafer level burn-in testing.

According to one embodiment of the present invention, the test system comprises a probe card and n (n is a positive integer) chips. The probe card comprises m (m is a positive integer) first signal contacts for receiving m test signals from m first test channels of the tester, and n second signal contacts for providing n test results to n second test channels of the tester. The probe card further comprises a contact array comprising (m+1) rows and n columns. Each row has n contacts and each column has (m+1) contacts, wherein each one of the contacts in a first row is electrically coupled to a respective one of the n second signal contacts, and each one of the contacts in the ith row is electrically coupled to a respective one of the m first signal contacts, wherein i is an integer and $2 \leq i \leq (m+1)$. Each one of the chip comprises m input pads, a detection circuit, and a check pad. Each one of the input pads receives a respective one of the m test signals from the tester through the m contacts in a respective one of the n columns of the contact array. The detection circuit receives signals from the m input pads to generate an output signal at a check pad. The check pad provides one of the n test results to the tester through one contact in a respective one of the n columns of the contact array.

Another aspect of the present invention is to provide a device for performing a continuity test.

According to one embodiment of the present invention, the device comprises m input pads, a detection circuit and a check pad. Each one of the m input pads receives a respective one of m test signals from an external equipment. The detection circuit receives signals from the m input pads once to generate an output signal at the check pad. The check pad provides the output signal to the external equipment.

BRIEF DESCRIPTION OF THE DRAWINGS

The invention will be described according to the appended drawings in which.

DETAILED DESCRIPTION OF THE INVENTION

The invention disclosed herein provides a test system for performing a wafer level burn-in testing. The term "wafer level burn-in testing", as used herein, represents that chips are burned-in at wafer level and then undergo a CP test to screen out chips with defects prior to packaging.

Figure 1:
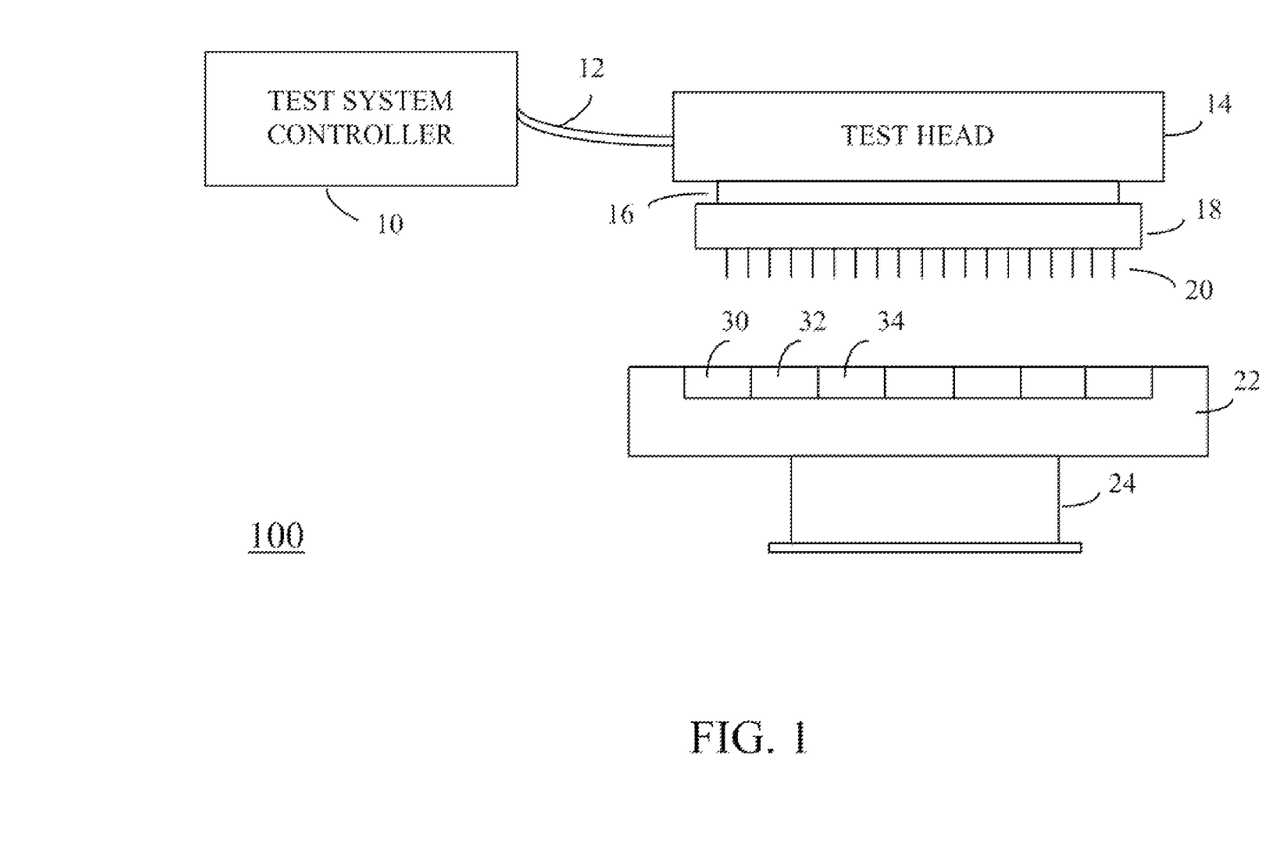
FIG. 1 shows a block diagram of a test system for performing a wafer level burn-in testing according to one embodiment of the present invention.

FIG. 1 shows a block diagram of a test system 100 for performing a wafer level burn-in testing according to one embodiment of the present invention. Referring to FIG. 1, the test system 100 comprises a test system controller 10, which may be an Automatic Test Equipment (ATE) tester or a general purpose computer. The test system controller 10 is connected by a communication cable 12 to a test head 14.

The tester head 14 may include a base 16 to which a probe card 18 is connected. The probe card 18 serves as the interface between the test head 14 and a wafer under test 22. The probe card 18 may be in contact with the wafer 22 through a plurality of needles 20 integrated with the probe card 18.

The test system 100 further includes a stage 24 for mounting the wafer 22 being tested. The stage 24 is movable to contact the wafer 22 with probe needles 20 on the probe card 18. A heating element (not shown) may be included within the stage 24 for supplying heat to the wafer 22. The heating element elevates the temperature of a plurality of chips 30, 32, and 34 disposed on the wafer 22 to the elevated temperature during a burn-in procedure.

Figure 2:
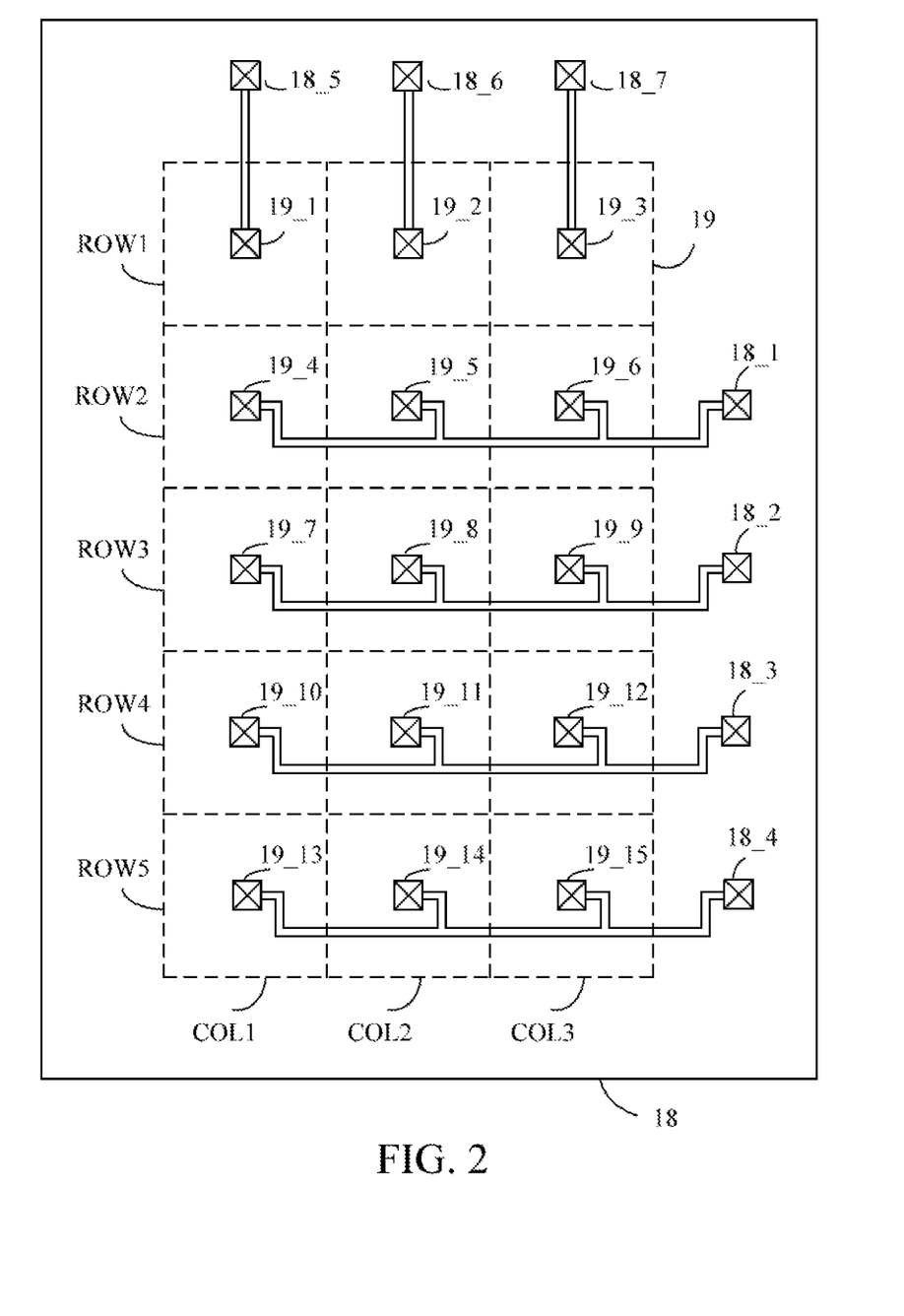
FIG. 2 is a plan view schematic showing an embodiment of the probe card of FIG. 1.

FIG. 2 is a plan view schematic showing an embodiment of the probe card 18 of FIG. 1. Referring to FIG. 2, the probe card 18 comprises a plurality of pads 18_1 to 18_7. The pads 18_1 to 18_7 are configured to receive test signals from the controller 10 of FIG. 1 and transmit the test response signals to the controller 10. The probe card 18 further comprises a contact array 19 composed of a plurality of rows ROW1, ROW2, and ROW3, ROW4, and ROW5 and a plurality of columns COL1, COL2, and COL3. Referring to FIG. 2, each of the rows is composed of three contacts and each of the columns is composed of five contacts. The contacts 19_1 to 19_15 of the contact array 19 are configured to transmit the test signals to the chips 30, 32, and 34 on the wafer 22 of FIG. 1 and sent back the test response signals by the corresponding needles 20 of FIG. 1.

Referring to FIG. 1, in one embodiment of the present invention, before the start of the burn-in procedure, the test system controller 10 transmits an instruction to the test head 14 so as to perform a continuity test. The continuity test determines whether there is a short or an open in the path between the test head 14 and the wafer under test 22. For example, a needle 20 may be damaged, thereby unable to connect to the corresponding pad of the chip, or one of the pads of the chip may be short-circuited to a power line or ground. When a short or an open occurs in the path, the test system controller 10 cannot apply an appropriate bias voltage to the chip under test or cannot effectively receive the test result. Therefore, the continuity test is performed at the beginning to ensure that no shorts or opens occur in the path.

Figure 3:
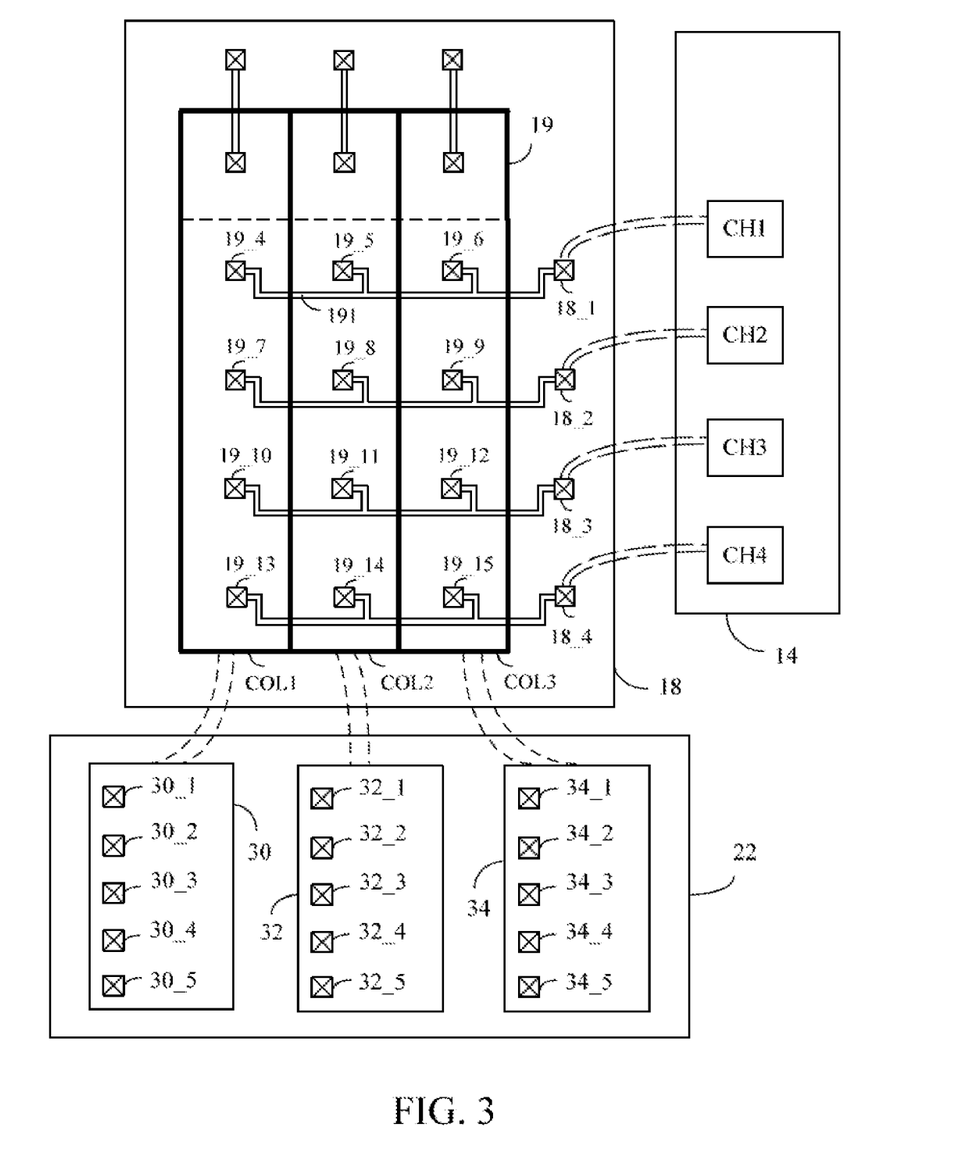
FIG. 3 is a conceptual diagram showing the operation of the test system during the continuity test according to one embodiment of the present invention.

FIG. 3 is a conceptual diagram showing the operation of the test system 100 during the continuity test according to one embodiment of the present invention. Referring to FIG. 3, the test head 14 comprises a set of channels CH1 to CH4, one for each pad on the probe card 18. To be more specific, the channel CH1 generates a first test signal to the pad 18_1 on the probe card 18, the channel CH2 generates a second test signal to the pad 18_2 on the probe card 18, the channel CH3 generates a third test signal to the pad 18_3 on the probe card 18, and the channel CH4 generates a fourth test signal to the pad 18_4 on the probe card 18.

Referring to FIG. 3, since the pads 19_4, 19_5, and 19_6 of the array 19 are electrically connected to each other by an electric trace 191, the first test signal from the channel CH1 are transmitted to the pads 19_4, 19_5, and 19_6 simultaneously. The second test signal from the channel CH2 is similarly transmitted to the pads 19_7, 19_8, and 19_9 of the array 19, the third test signal from the channel CH3 is similarly transmits to the pads 19_10, 19_11, and 19_12 of the array 19, and the fourth test signal from the channel CH4 is similarly transmits to the pads 19_13, 19_14, and 19_15 of the array 19.

Referring to FIG. 1, the probe card 18 positioned on the wafer 22 is in contact with the chips on the wafer 22 through the needles 20 integrated with the probe card 18. The needles 20 are operable to be in electrical contact with the pads of each one of the chips on the wafer 22 for providing test signals. To be more specific, referring to FIG. 3, the pads 19_4, 19_7, 19_10, 19_13 of the column COL1 of the array 19 are in contact with pads 30_1, 30_2, 30_3, 30_4 through the corresponding needles of FIG. 1; the pads 19_5, 19_8, 19_11, 19_14 of the column COL2 are in contact with pads 32_1, 32_2, 32_3, 32_4 through the corresponding needles of FIG. 1; and the pads 19_6, 19_9, 19_12, 19_15 of the column COL3 are in contact with pads 34_1, 34_2, 34_3, 34_4 through the through the corresponding needles of FIG. 1.

The operation of the test system 100 and testing method thereof during the continuity test are described below with reference to FIGS. 1 to 3. The test system controller 10 generates parallel test signals to the channels CH1 to CH4 of the test head 14 through the cable 12. The probe card 18 receives the parallel test signals from the test head 14, and transmits the parallel test signals to the chips 30, 32, and 34 on the wafer 22. The chips 30, 32, and 34 receive the parallel test signals from the probe card 18, and operate based on the parallel test signals. In such a configuration, the pad 30_1 of the chip 30, the pad 32_1 of the chip 32, and the pad 34_1 of the chip 34 receive the test signal from the channel CH1 simultaneously, the pad 30_2 of the chip 30, the pad 32_2 of the chip 32, and the pad 34_2 of the chip 34 receive the test signal from the channel CH2 simultaneously; the pad 30_3 of the chip 30, the pad 32_3 of the chip 32, and the pad 34_3 of the chip 34 receive the test signal from the channel CH3 simultaneously; and the pad 30_4 of the chip 30, the pad 32_4 of the chip 32, and the pad 34_4 of the chip 34 receive the test signal from the channel CH4 simultaneously.

Figure 4:
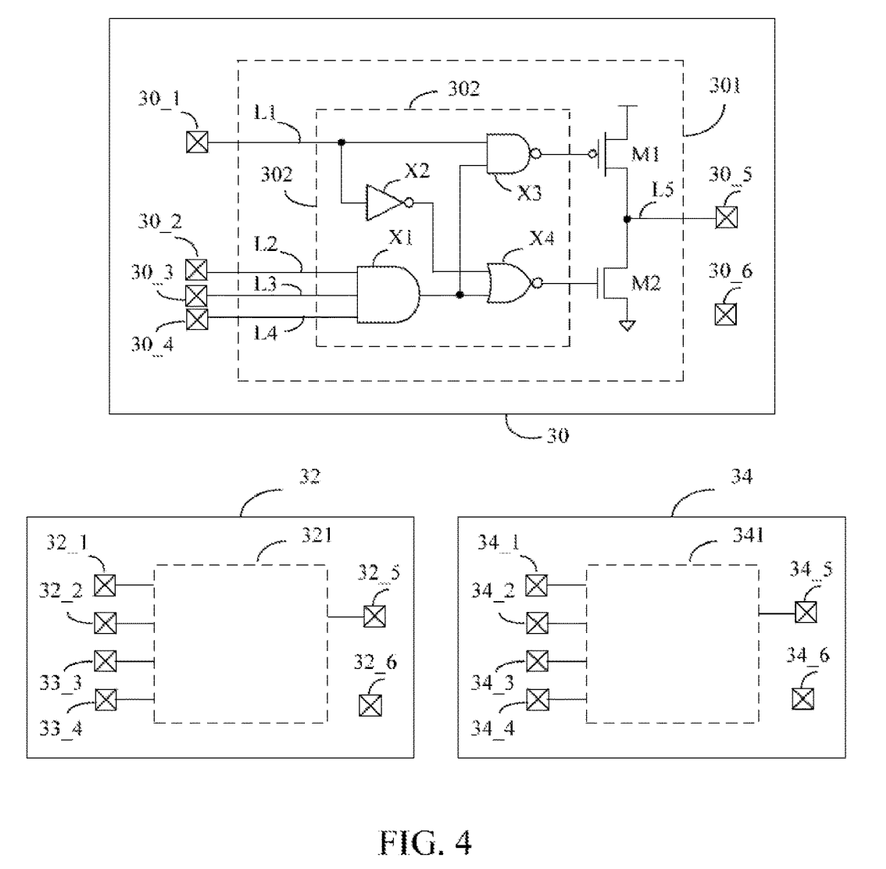
FIG. 4 is a circuit diagram showing an embodiment of the detection circuits of the chips.

After receiving the test signals from the probe card 18, a detection circuit is used for detecting a continuity fault condition, e.g. a short or open condition, exists in the path between the test head 14 and the chips on the wafer 22. FIG. 4 is a circuit diagram showing an embodiment of the detection circuit 301 of the chip 30, the detection circuit 321 of the chip 32, and the detection circuit 341 of the chip 34. Referring to FIG. 4, the detection circuit 301 of the chip 30 comprises a logic circuit 302, a PMOS transistor M1, and a NMOS transistor M2. In this embodiment, the logic circuit 302 is composed of an AND gate circuit X1, an inverter X2, a NAND gate circuit X3, and a NOR gate circuit X4. The configuration of the detection circuit 321 of the chip 32 and the detection circuit 341 of the chip 34 are the same as the detection circuit 301 of the chip 30 and thus the related circuits will not be repeated here.

Referring to FIG. 4, the detection circuit 301 of the chip 30 receives signals L1, L2, L3, and L4 from the pads 30_1, 30_2, 30_3, and 30_4, and generates a detection result L5 at the remaining pad 30_5. The detection circuit 321 of the chip 32 receives signals from the pads 32_1 to 32_4, and generates a detection result at the remaining pad 32_5. The detection circuit 341 of the chip 34 receives signals from the pads 34_1 to 34_4, and generates a detection result at the remaining pad 34_5.

Figure 5:
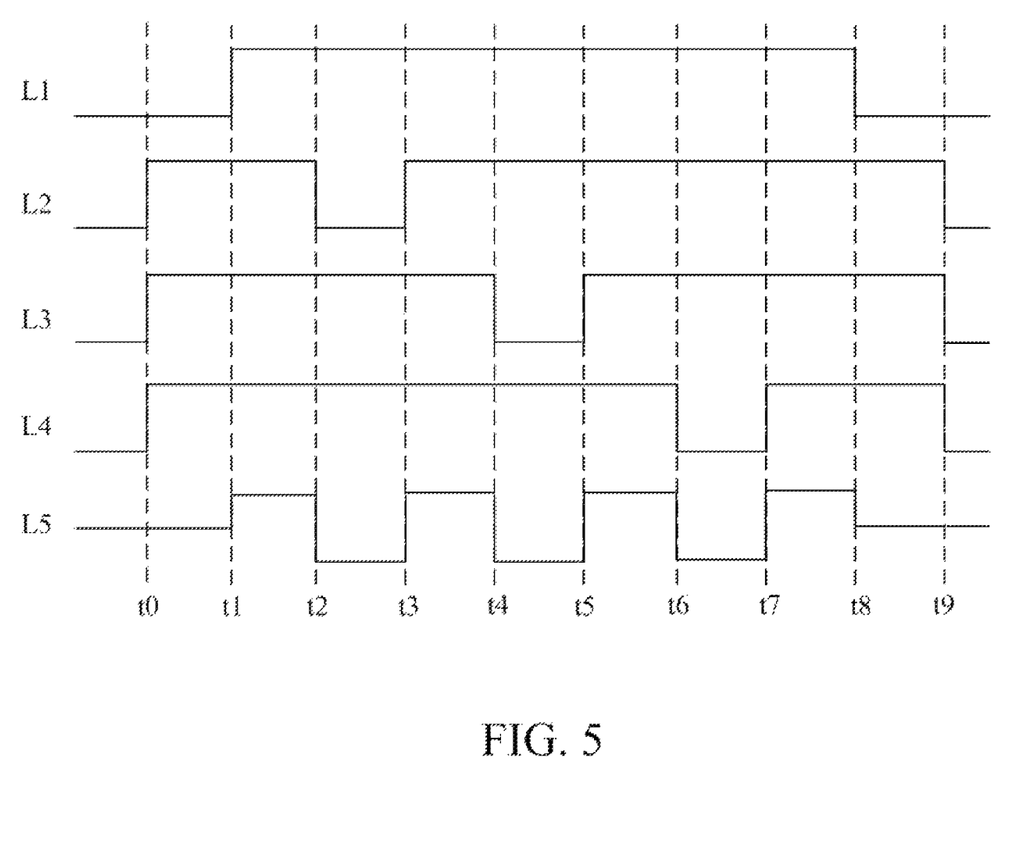
FIG. 5 is a timing diagram illustrating an operation of the detection circuits of FIG. 4.

FIG. 5 is a timing diagram illustrating an operation of the detection circuits 301 of FIG. 4. Referring to FIG. 5, before the time t1, the input signal L1 is at the logic low level. When the input signal L1 is at the logic low level, the PMOS transistor M1 and the NMOS transistor M2 in FIG. 4 turn off, thereby floating the signal L5 at the pad 30_5. After the time t1, only one of the input signals L2 to L4 changes its logic level once. For example, the input signals L2, L3, and L4 are at the logic high level between the time t1 and t2. Thereafter, the input signal L2 is transmitted to a logic low level, while the other signals L3 and L4 remain unchanged between the time t2 and t3. The detection circuit 301 provides the output signal L5 in response to the different logic levels of the input signals L2 to L4. A truth table of the detection circuit 301 is shown below:

TABLE 1

| L1 | L2 | L3 | L4 | L5 |
|----|----|----|----|----|
| 0  | X  | X  | X  | Hi-Z |
| 1  | 1  | 1  | 1  | 1  |
| 1  | 0  | 1  | 1  | 0  |
| 1  | 1  | 0  | 1  | 0  |
| 1  | 1  | 1  | 0  | 0  |

Through the truth table of the detection circuit 301, the detection circuit 301 can detect whether there is a short or an open in the path between the test head 14 and the wafer under test 22. For example, when the input signal L2 is transmitted to a logic low level and the other signals L3 and L4 remain unchanged, the output signal L5 is at the logic low level according to the data of the truth table of Table 1. Therefore, if the detection circuit 301 generates the output signal L5 at the logic high level rather than the logic low level, it represents that the pad 30_2 connected to the detection circuit 301 may be short-circuited to a power line and thus is pulled up to a logic high level.

Figure 6:
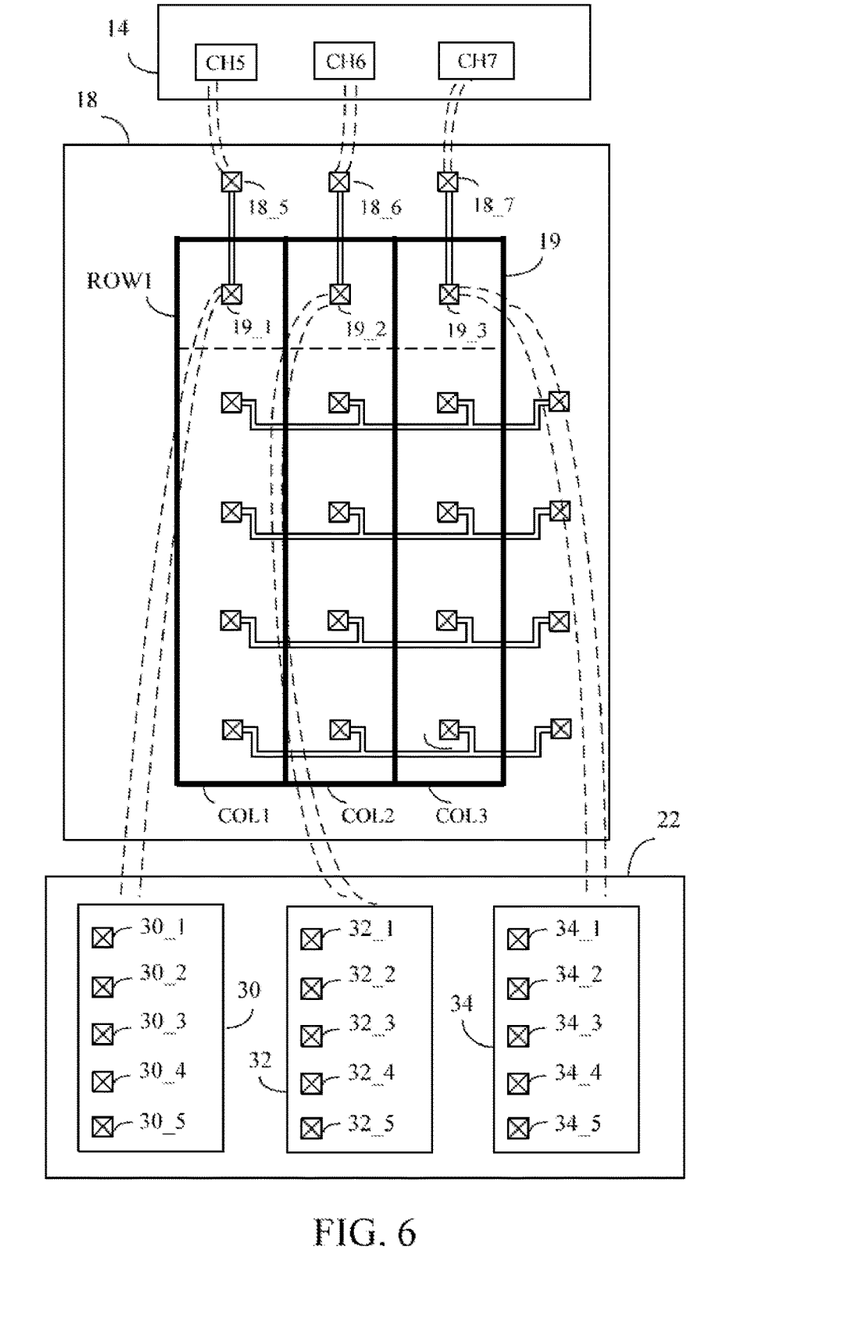
FIG. 6 is a conceptual diagram showing the operation of the test system during the continuity test.

Referring to FIG. 6, after the output signals are generated at the pads 30_5, 32_5, and 34_5, those signals are sent to the pads 19_1, 19_2, and 19_3 of the same row ROW1 of the array 19 through the needles of FIG. 1. Since the pads 19_1, 19_2, and 19_3 are respectively electrically connected to the pads 18_5, 18_6, and 18_7 by electric traces, the output signals generated at the pads 19_1, 19_2, and 19_3 are then transmitted to the pads 18_5, 18_6, and 18_7, and ultimately to the channels CH5, CH6, and CH7 of the test head 14. Therefore, the test system controller 10 of FIG. 1 can receive the test results of the chips 30, 32, and 34 from the test head 14, thereby using the received signals to determine whether a continuity fault condition, e.g. a short or open condition, exists in the path between the test head 14 and a wafer under test 22.

Figure 7:
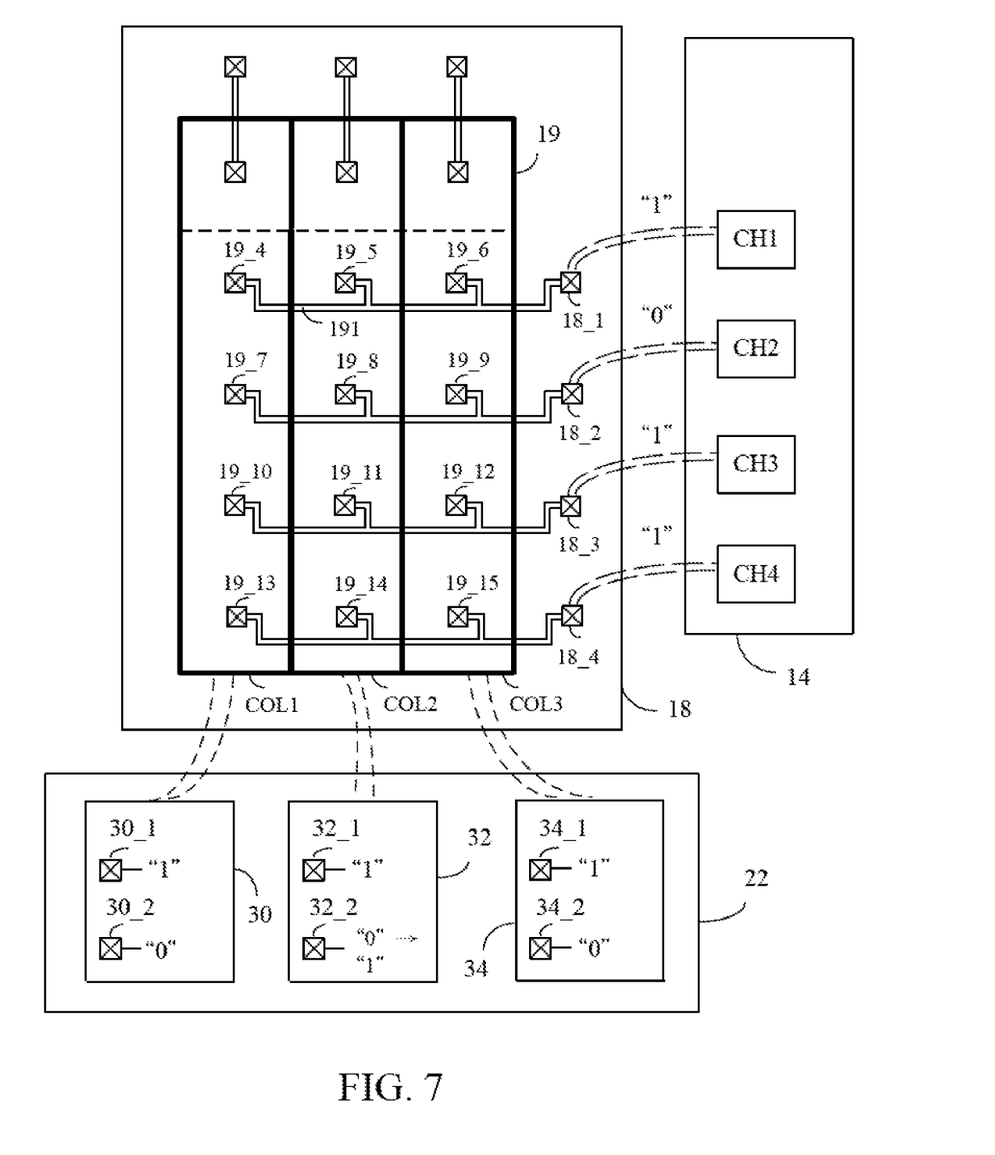
FIG. 7 is a conceptual diagram showing the operation of the test system 100 during the continuity test.

For example, referring to FIG. 7, a continuity fault condition exists in the chip 32. In this example, the pad 32_2 of the chip 32 is short-circuited to a power line (not shown). Referring to FIG. 7, during the continuity test, the channel CH1 sends the first test signal at the logic high level, the channel CH2 sends the second test signal at the logic low level, the channel CH3 sends the third test signal at the logic high level, and the channel CH4 sends the fourth test signal at the logic high level. Thereafter, the first test signal is transmitted through the pads 19_4, 19_5, and 19_6, corresponding needles, and ultimately to the pads 30_1 of the chip 30, the pad 32_1 of the chip 32, and the pad 34_1 of the chip 34. The remaining test signals are transmitted to the other pads of the corresponding chips in the same manner. Therefore, the pad 30_2 of the chip 32 receives the second test signal at the logic low level from the channel CH2 and the detection circuit of the chip 32 generates a test response signal at the logic low level as predicted in Table 1 if no shorts or opens occur.

Figure 8:
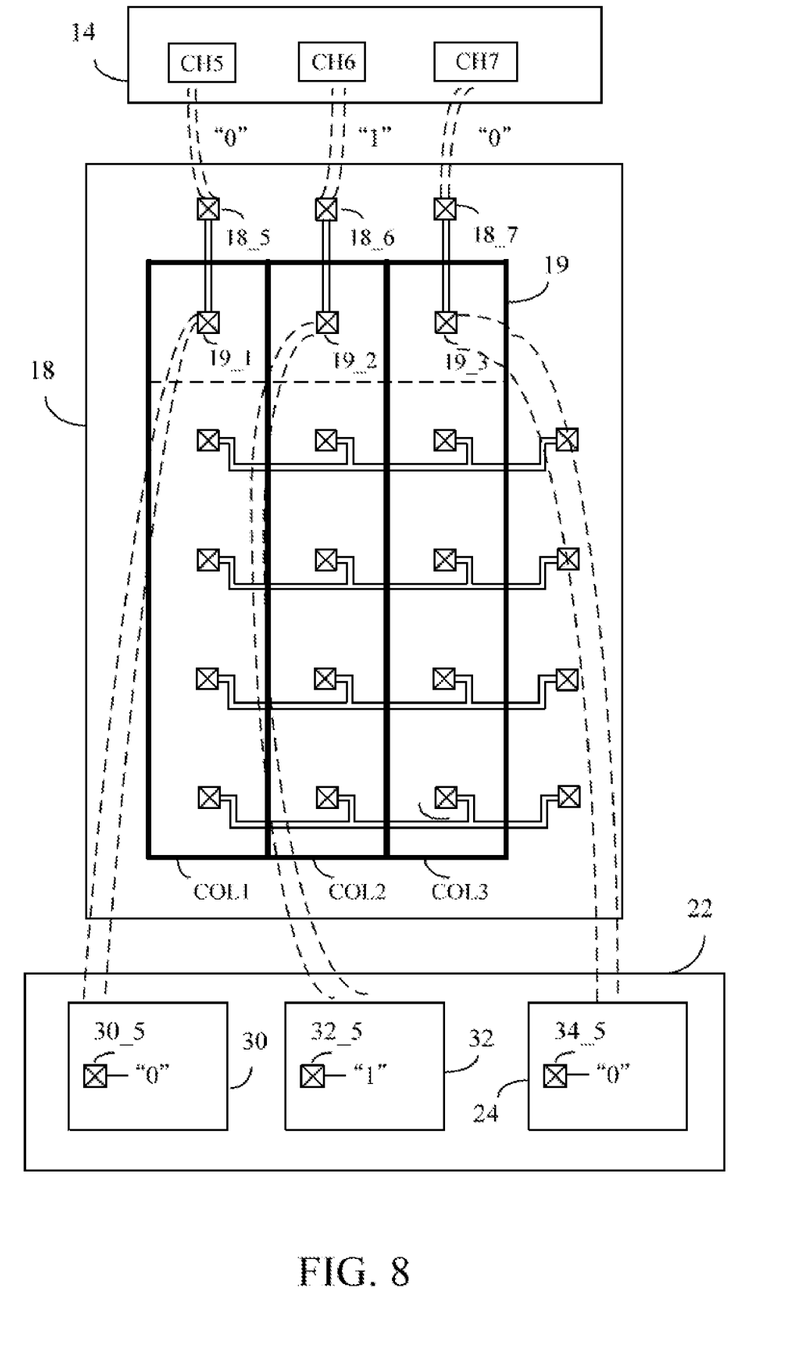
FIG. 8 is a conceptual diagram showing the operation of the test system during the continuity test.

However, since the pad 32_2 is short-circuited to the power line in this example, the detection circuit of the chip 32 receives an input signal at the logic high level at the pad 32_2. Therefore, the detection circuit generates the output signal at the logic high level at the pad 32_5 as shown in FIG. 8. The output signals generated from the pads 30_5, 32_5, and 34_5 are then transmitted through the corresponding needles, the probe card 18, the channels CH5, CH6, and CH7 of the test head 14, and ultimately to the test system controller 10. Since the chip 32 cannot perform a predetermined operation in response to the parallel test signals sent from the controller 10, the controller 10 can detect that the continuity fault condition occurs in the path between the channel CH2 and the chip 32 based on the test results.

In a similar way as mentioned above, the controller 10 can detect the continuity fault condition by varying a logic level of one of the first, second, third, and fourth test signals once. When a logic level transition of one of the first, second, third, and fourth test signals occurs, three test results can be obtained. Each of the test results indicates whether the pads of one of the chips 30, 32, and 34 certainly receive the correct test signals or not. In other words, when the test system controller 10 generates four parallel test signals to the pads of the chips 30, 32, and 34 through four channels CH1 to CH4, twelve test results are sent back to the controller 10 through the channels CH5 to CH7.

Referring to FIG. 6, among the twelve test results, four of them indicate whether one or more fault conditions exists in the path between the channel CH1 and the pad 30_1 of the chip 30, between the channel CH2 to the pad 30_2 of the chip 30, between the channel CH3 and the pad 30_3 of the chip 30, and between the channel CH4 and the pad 30_4 of the chip 30; four of them indicate whether one or more fault conditions exists in the path between the channel CH1 to the pad 32_1 of the chip 32, between the channel CH2 to the pad 32_2 of the chip 32, between the channel CH3 and the pad 32_3 of the chip 32, and between the channel CH4 and the pad 32_4 of the chip 32; and the others of the them indicate whether one or more fault conditions exists in the path between the channel CH1 and pad 34_1 of the chip 34, between the channel CH2 to the pad 34_2 of the chip 34, between the channel CH3 and the pad 34_3 of the chip 34, and between the channel CH4 and the pad 34_4 of the chip 34.

Figure 9:
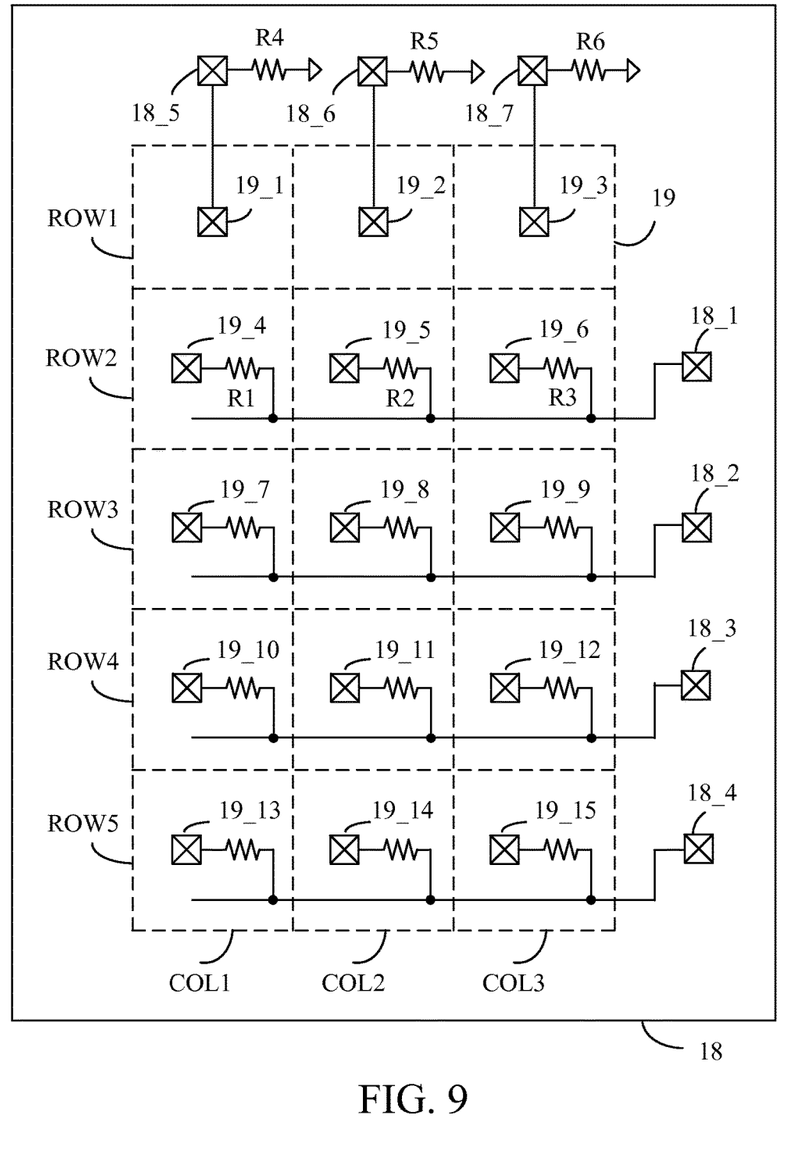
FIG. 9 is a plan view schematic showing an embodiment of the probe card with resistors.

Referring to FIG. 3, the pads 19_4, 19_5, and 19_6 of the array 19 are electrically connected to each other by the electric trace 191. Since the pads in the same row are connected together, noise may be coupled to each other. In order to provide noise immunity, resistors can be disposed at the adjacent pads. FIG. 9 is a plan view schematic showing an embodiment of the probe card 18 with resistors. Referring to FIG. 9, a resistor R1 is disposed between the pad 19_4 and the pad 18_1, a resistor R2 is disposed between the pad 19_5 and the pad 18_1, and a resistor R3 is disposed between the pad 19_6 and the pad 18_1. The resistors R1, R2, and R3 can also be used to limit the electrical short current to the connected pads if one or more pads are short-circuited to a ground line or a power line. In addition, a resistor R4 can be disposed between the pad 18_5 and a constant voltage source (e.g., ground). Therefore, if the PMOS transistor M1 and the NMOS transistor M2 of FIG. 4 turn off, the pad 18_5 can avoid floating.

Referring to FIG. 1, after the continuity test is completed, and the continuity fault condition in the path between the test head 14 and the chips 30, 32, and 34 is excluded, the following burn-in procedure proceeds. The procedure of burn-in a chip involves powering up the chips 30, 32, and 34 at an elevated temperature to accelerate the failure of latent defective chip. After the burn-in procedure and the following CP test are complete, i.e., a wafer level burn-in testing is completed, the wafer 22 is scribed, thereby dividing the wafer 22 into the individual chips. The defective chips will be discarded and the other good chips are assembled into packaged devices.

Referring to FIG. 4, the chip 30 comprises the plurality of pads 30_1 to 30_6. The pads 30_1 to 30_6 are classified into testing pads and bonding pads. The testing pads are pads used for testing the chips at the wafer level, and the bonding pads are pads used for wire bonding. As mentioned above, the pads 30_1 to 30_5 are used for testing the chip 30. Through the testing pads 30_1 to 30_5, test signals are inputted to the chip 30 and the test response signal is outputted by the chip 30.

Figure 10:
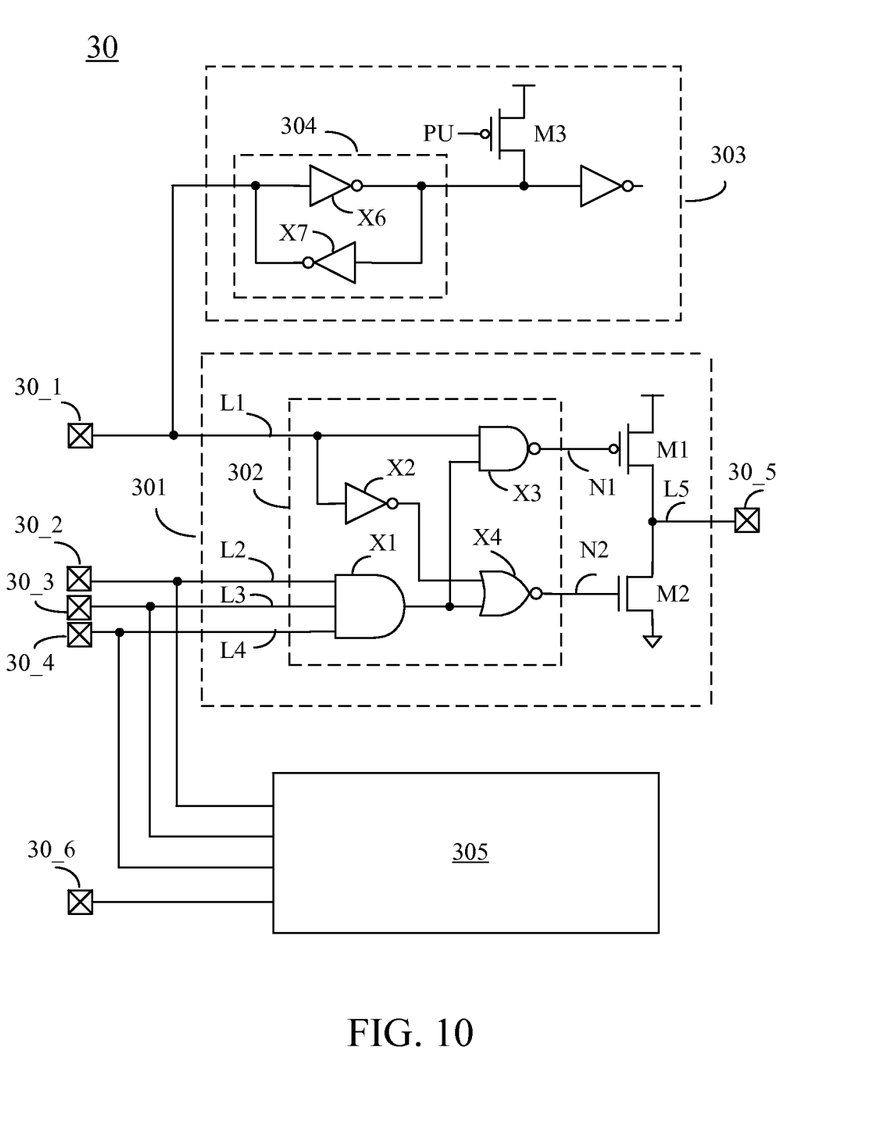
FIG. 10 is a circuit diagram showing parts of the circuit of the chip.

The bonding pads are used to connect with a lead frame of a package through a metal line in a package bonding process. In order to cause most of the pads 30_1 to 30_5 to be used for both testing and wire bonding, a logic circuit is required to disable the detection circuit 301 when the chip 30 is packaged. FIG. 10 is a circuit diagram showing parts of the circuit of the chip 30. Referring to FIG. 10, the chip 30 further comprises an enable circuit 303 and an internal circuit 305. The enable circuit 303 comprises a pull-up device M3 and a latch 304. The latch 304 comprises a pair of inverters connected back to back, wherein the inverter X6 is called the feed-forward inverter, and inverter X7 is called the feedback inverter. For the circuit of FIG. 10 to work properly, the feedback inverter X7 must be a smaller inverter, thus having a weaker drive output, than the feed-forward inverter X6.

The operation of the enable circuit 303 is described below. During the wafer level burn-in testing, the test system controller 10 generates parallel test signals to test the chips 30, 32, and 34 on the wafer 22 as shown in FIG. 1. In this condition, the detection circuit 301 and the enable circuit 303 of FIG. 10 receive the test signal L1 at the logic high level from the controller 10 through the pad 30_1. Therefore, the detection circuit 301 performs a predetermined operation in response to the parallel test signals received through the pads 30_2 to 30_4. The test result is then sent back to the test system controller 10 through the pad 30_5 for further analysis.

After the continuity test and burn-in procedure, the defective chips are screened out and the chip packaging process proceeds. After the packaging process, the bonding pads of the chip are bonded with package leads, so that the chip can communicate electrical signals to external or "off-chip" elements. Referring to FIG. 10, the pad 30_1 is used for testing the chip 30 but is not used for wire bonding. The pads 30_2 to 30_5 are used for both testing and wire bonding. The pad 30_6 is used only for wire bonding. Therefore, the pads 30_2 to 30_6 can receive external electrical signals after chip packaging, and the internal circuit 305 accordingly begins to operate. To avoid signal interruption, the detection circuit 301 is selectively operated by detecting the logic level of the input signal at the pad 30_1.

Referring to FIG. 10, during the wafer level burn-in testing, since the chip 30 is in contact with the probe card 18 through the needles, the signal L1 is pulled up to a logic high level. Upon detecting the logic high level of the signal at the pad 30_1, the detection circuit 301 operates in response to the signals from the pads 30_2 to 30_4. Because of the low output driving ability of the weak inverter X7, the signal at the pad 30_1 is able to overdrive the output of the weak inverter X7 to allow the latch circuit 304 to change state. However, after the chip 30 is packaged, the pad 30_1 is unable to be in contact with the external element, so that the logic level at the pad 30_1 is determined by the enable circuit 303 instead.

Figure 11:
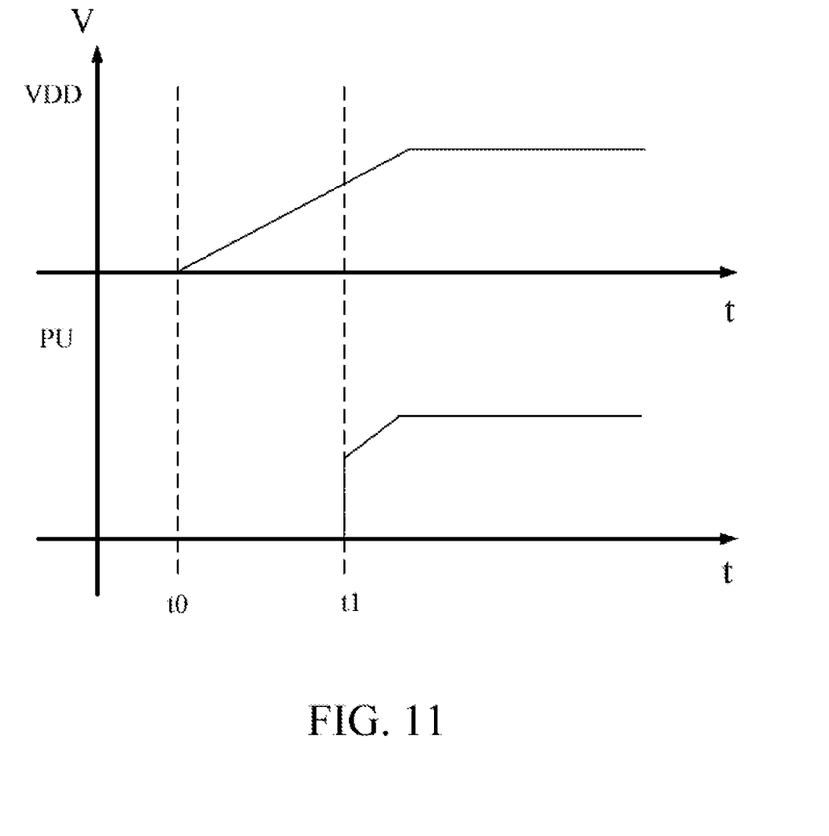
FIG. 11 is a timing diagram illustrating an operation of the enable circuit of FIG. 10.

FIG. 11 is a timing diagram illustrating an operation of the enable circuit 303 of FIG. 10. Referring to FIG. 11, the packaged chip 30 is powered on at time t0. At the time t0, a power up signal PU is at the logic low level, so that the PMOS transistor M3 of FIG. 10 turns on. When the PMOS transistor M3 turns on, the output signal L1 of the latch 304 is initialized to a logic low level. At time t1, the power supply VDD is higher than a critical voltage level, such that the power up signal PU is transmitted to a logic high level. When the power up signal PU reaches a logic high level, the PMOS transistor M3 turns off, so that the latch 304 maintains the latched condition and continues to provide the signal L1 at the logic low signal. Upon receiving the logic low signal, the detection circuit 302 generates a signal N1 at the logic high level and generates a signal N2 at the logic low level, thereby turning off the PMOS transistor M1 and the NMOS transistor M2. In this manner, the detection circuit 301 is deactivated after packaging.

The above-described embodiments of the present invention are intended to be illustrative only. Numerous alternative embodiments may be devised by those skilled in the art without departing from intent of the disclosed invention or from the scope of the following claims.

What is claimed is:

1. A test system for performing a wafer level burn-in testing, comprising:
   a probe card, comprising:
      m (m is a positive integer) first signal contacts for receiving m test signals from m first test channels of a tester;
      n (n is a positive integer) second signal contacts for providing n test results to n second test channels of the tester; and
      a contact array comprising (m+1) rows and n columns, each row having n contacts and each column having (m+1) contacts, wherein each one of the contacts in a first row is electrically coupled to a respective one of the n second signal contacts, and each one of the contacts in the ith row is electrically coupled to a respective one of the m first signal contacts, wherein i is an integer and $2 \leq i \leq (m+1)$; and
   n chips, each one of the chips comprising:
      m input pads, wherein each one of the input pads receives a respective one of the m test signals from the tester through the m contacts in a respective one of the n columns of the contact array;
      a detection circuit for receiving signals from the m input pads to generate an output signal at a check pad; and
      the check pad for providing one of the n test results to the tester through one contact in a respective one of the n columns of the contact array.

2. The test system of claim 1, wherein the test system executes an open-short test and a burn-in procedure in sequence prior to packaging.

3. The test system of claim 2, wherein the test system executes the open-short test by changing a logic level of one of the m test signals once so as to obtain the n test results.

4. The test system of claim 3, wherein the tester determines whether there is a short in the path between the probe card and the chips based on the n test results.

5. The test system of claim 3, wherein the tester determines whether there is an open in the path between the probe card and the chips based on the n test results.

6. The test system of claim 2, wherein the test system executes the open-short test by changing logic levels of the m test signals in sequence so as to obtain the m*n test results.

7. The test system of claim 1, wherein each one of the contacts in the ith row is electrically coupled to a respective one of the n second signal contacts through a resistor.

8. The test system of claim 1, wherein each one of the second signal contacts is electrically coupled to a constant voltage source through a resistor.

9. The test system of claim 1, wherein the detection circuit comprises:
- a logic circuit for receiving the signals from the m input pads;
- a PMOS transistor having a gate for receiving a first output signal from the logic circuit; and
- a NMOS transistor having a gate for receiving a second output signal from the logic circuit;
- wherein the PMOS transistor and the NMOS transistor are electrically coupled to the check pad.

10. The test system of claim 1, wherein the check pad is used for both testing and wire bonding, one of the m input pads is only used for testing, and the others of the m input pads are used for both testing and wire bonding.

11. The test system of claim 10, wherein the chip further comprises:
- an enable circuit for providing a disable signal to turn off the PMOS transistor and the NMOS transistor after the chip is packaged.

12. The test system of claim 11, wherein the chip further comprises:
- a pull-up device for receiving a power up signal to provide a pull high signal; and
- a first inverter for receiving the pull high signal to generate the disable signal to turn off the PMOS transistor and NMOS transistor after the chip is packaged; and
- a second inverter for receiving the disable signal to generate the pull high signal;
- wherein the first inverter has a weaker driving ability than the second inverter.

* * * * *